(12) United States Patent
Chang

(10) Patent No.: US 7,932,775 B2
(45) Date of Patent: Apr. 26, 2011

(54) DIGITAL DEMODULATION DEVICE AND RELATED METHOD

(75) Inventor: Yu-Chi Chang, Taoyuan County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 289 days.

(21) Appl. No.: 12/366,637

(22) Filed: Feb. 5, 2009

(65) Prior Publication Data

US 2010/0194472 A1    Aug. 5, 2010

(51) Int. Cl.
*H03D 1/02* (2006.01)
*H04H 20/49* (2008.01)

(52) U.S. Cl. ........ 329/353; 329/363; 375/346; 375/349; 455/312; 455/296; 381/15; 381/94.1

(58) Field of Classification Search ............... 329/347, 329/349, 353, 363; 375/320, 340, 346, 349; 455/296, 295, 303, 309, 310, 312, 337; 381/4, 381/15, 94.1
See application file for complete search history.

(56) References Cited

U.S. PATENT DOCUMENTS 7,672,411 B2 *   3/2010   Colmer et al. ................ 375/350

\* cited by examiner

*Primary Examiner* — Robert Pascal
*Assistant Examiner* — Ryan Johnson
(74) *Attorney, Agent, or Firm* — Winston Hsu; Scott Margo

(57) ABSTRACT

A digital demodulation device for demodulating an amplitude modulation (AM) signal whose carrier has a first frequency includes: a processing circuit for performing first path digital processing and second path digital processing according to a second frequency and digital values of the AM signal, where the first path digital processing represents performing down conversion by mixing the AM signal with a first sinusoidal signal whose frequency is equal to the second frequency, the second path digital processing represents performing down conversion by mixing the AM signal with a second sinusoidal signal whose frequency is equal to the second frequency, the second frequency is equal to the first frequency plus a predetermined frequency shift, and the second sinusoidal signal is orthogonal to the first sinusoidal signal; and an output stage for outputting an output signal according to processing results of the first path digital processing and the second path digital processing.

20 Claims, 6 Drawing Sheets

1

DIGITAL DEMODULATION DEVICE AND RELATED METHOD

BACKGROUND

The present invention is related to digital processing, and more particularly, to digital demodulation devices and methods.

Please refer to FIG. 1. FIG. 1 illustrates a mathematical model of a digital demodulator in a receiver according to the related art. As shown in FIG. 1, mixers 10-1 and 10-2, filters 20-1 and 20-2, and an absolute value calculation unit 40 (which is labeled as "ABS") represent digital operations of mixing, filtering, and absolute value calculation, respectively. In addition, adders 30-1 and 30-2 represent involving quantization noises e1(t) and e2(t) during digital operations of the upper and the lower paths shown in FIG. 1, respectively. Additionally, an amplitude modulation (AM) signal (S(t)*cos (2*pi*fc*t)) inputted into the mixers 10-1 and 10-2 represents a carrier cos(2*pi*fc*t) carrying S(t) (which is a function of time t), where the AM signal's envelope corresponds to S(t), pi (i.e. π) represents the ratio of the circumference of a circle to its diameter, and fc represents the frequency of the carrier cos(2*pi*fc*t).

In an ideal case, the mixer 10-1 mixes the AM signal (S(t)*cos(2*pi*fc*t)) with a signal cos(2*pi*fc*t), and the mixer 10-2 mixes the AM signal (S(t)*cos(2*pi*fc*t)) with a signal sin(2*pi*fc*t), so the digital demodulator may correctly operate to generate a demodulated result (S(t)+e3(t)), where e3(t) represents random noises from the quantization noises e1(t) and e2(t). In a real case, however, the frequency fc of the signal cos(2*pi*fc*t) and the signal sin(2*pi*fc*t) respectively utilized by the mixers 10-1 and 10-2 in this mathematical model is typically inaccurate due to difficulties in design. For example, fc'=fc+50 Hz, which means there exists a difference of 50 Hz between the inaccurate frequency fc' and the carrier frequency fc generated in a transmitter which transmits the AM signal (S(t)*cos(2*pi*fc*t)) to the receiver. As a result, the demodulated result (S(t)+e3(t)) is overlapped with a noise component of 50 Hz. Unfortunately, if S(t) represents an audio signal to be played back, the noise component of 50 Hz will be heard and can be very irritating to a listener.

Typically, the related art method involves plenty of calculations which must be applied to correct the inaccurate frequency fc', so as to accurately lock onto the carrier frequency fc generated in the transmitter. Therefore, cumbersome calculations lead to a heavy processing load for a digital processing unit of the receiver. In addition, it would be very complicated to implement the corresponding algorithm in order to achieve better performance.

SUMMARY

It is an objective of the claimed invention to provide digital demodulation devices and methods.

An exemplary embodiment of a digital demodulation device for demodulating an amplitude modulation (AM) signal whose carrier has a first frequency comprises: a processing circuit for performing first path digital processing and second path digital processing according to a second frequency and a plurality of digital values of the AM signal, wherein the first path digital processing represents performing down conversion by mixing the AM signal with a first sinusoidal signal whose frequency is equal to the second frequency, the second path digital processing represents performing down conversion by mixing the AM signal with a second sinusoidal signal whose frequency is equal to the second frequency, the second frequency is equal to the first frequency plus a predetermined frequency shift, and the second sinusoidal signal is orthogonal to the first sinusoidal signal; and an output stage, coupled to the processing circuit, for outputting an output signal according to first processing results of the first path digital processing and second processing results of the second path digital processing; wherein the predetermined frequency shift is not less than an upper bond frequency of a sensitive range of human hearing or a cut-off frequency of a latter stage of the output stage, so that a noise component corresponding to the predetermined frequency shift in the output signal is capable of being reduced or removed.

An exemplary embodiment of a digital demodulation method for demodulating an AM signal whose carrier has a first frequency comprises: performing first path digital processing and second path digital processing according to a second frequency and a plurality of digital values of the AM signal, wherein the first path digital processing represents performing down conversion by mixing the AM signal with a first sinusoidal signal whose frequency is equal to the second frequency, the second path digital processing represents performing down conversion by mixing the AM signal with a second sinusoidal signal whose frequency is equal to the second frequency, the second frequency is equal to the first frequency plus a predetermined frequency shift, and the second sinusoidal signal is orthogonal to the first sinusoidal signal; and outputting an output signal according to first processing results of the first path digital processing and second processing results of the second path digital processing; wherein the predetermined frequency shift is not less than an upper bond frequency of a sensitive range of human hearing or a cut-off frequency of a latter stage for utilizing the output signal, so that a noise component corresponding to the predetermined frequency shift in the output signal is capable of being reduced or removed.

An exemplary embodiment of a digital demodulation method for demodulating an AM signal whose carrier has a first frequency, the digital demodulation method comprises: providing a first portion of a program code for performing first path digital processing and second path digital processing according to a second frequency and a plurality of digital values of the AM signal, wherein the first path digital processing represents performing down conversion by mixing the AM signal with a first sinusoidal signal whose frequency is equal to the second frequency, the second path digital processing represents performing down conversion by mixing the AM signal with a second sinusoidal signal whose frequency is equal to the second frequency, the second frequency is equal to the first frequency plus a predetermined frequency shift, and the second sinusoidal signal is orthogonal to the first sinusoidal signal; and providing a second portion of the program code for generating a plurality of output values corresponding to first processing results of the first path digital processing and second processing results of the second path digital processing; wherein the predetermined frequency shift is not less than an upper bond frequency of a sensitive range of human hearing or a cut-off frequency of a latter stage for directly or indirectly utilizing the output values, so that a noise component corresponding to the predetermined frequency shift in an output signal for carrying the output values is capable of being reduced or removed.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims which refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
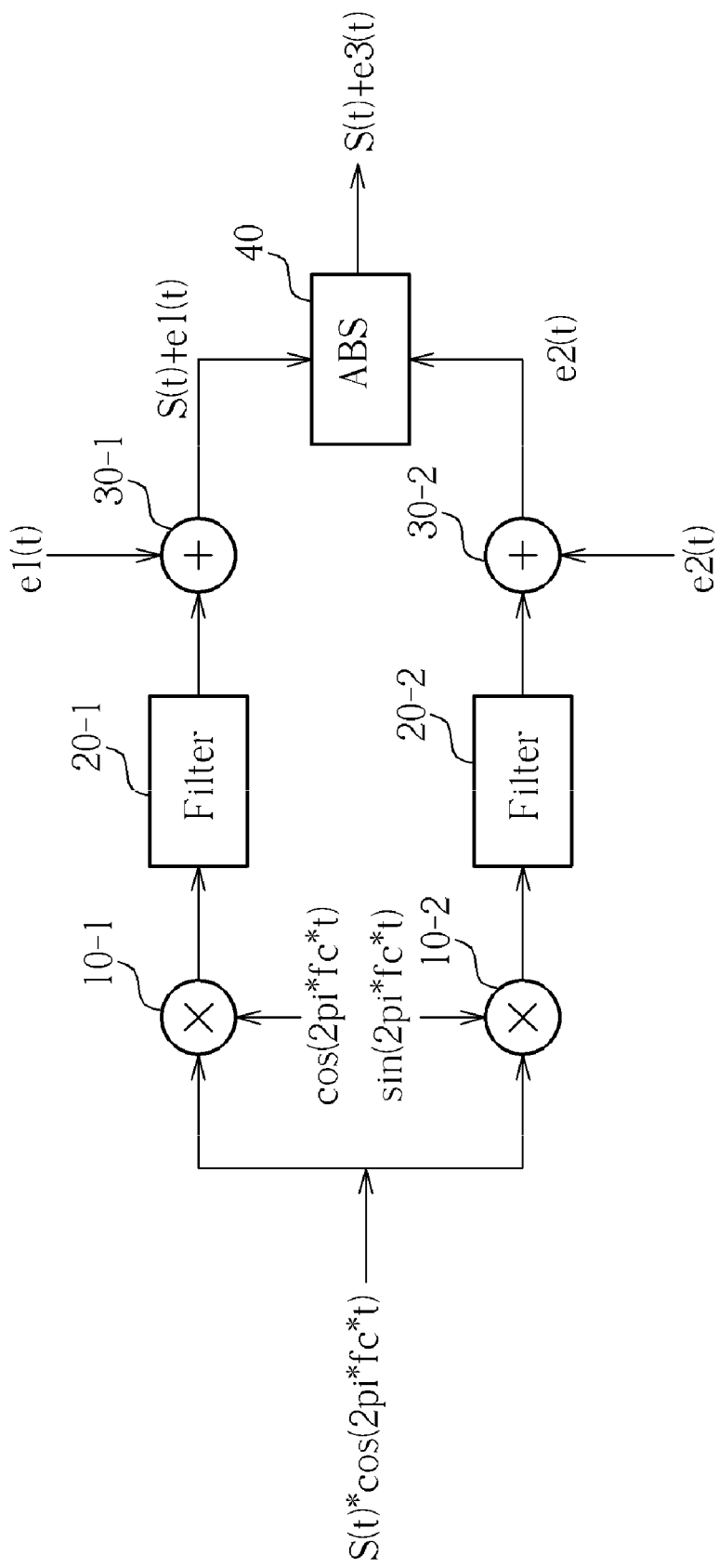
FIG. 1 illustrates a mathematical model of a digital demodulator according to the related art.
Figure 2:
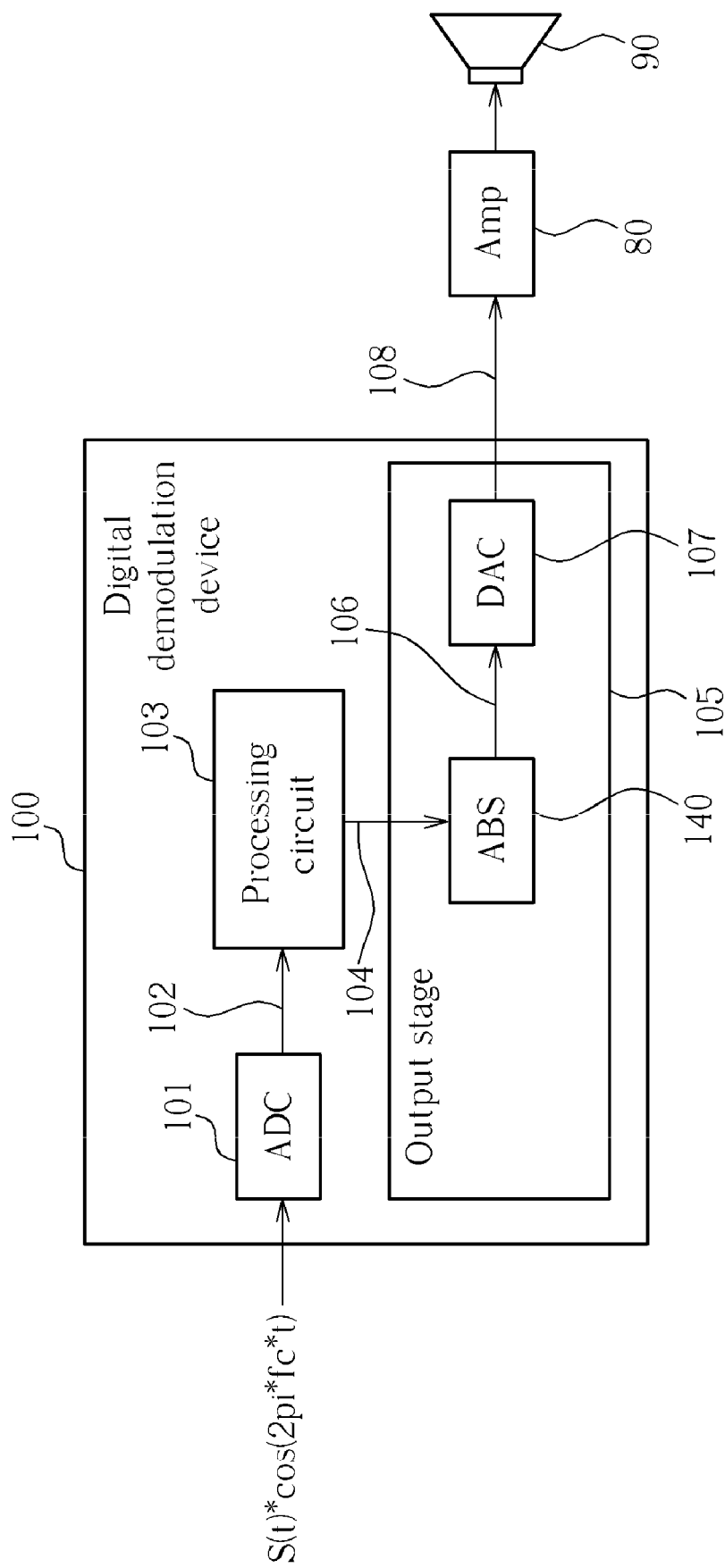
FIG. 2 is a diagram of a digital demodulation device for demodulating an amplitude modulation (AM) signal according to one embodiment of the present invention.

Please refer to FIG. 2. FIG. 2 is a diagram of a digital demodulation device 100 for demodulating an amplitude modulation (AM) signal according to a first embodiment of the present invention. In this embodiment, the AM signal to be demodulated can be the AM signal (S(t)*cos(2*pi*fc*t)) shown in FIG. 1, where the AM signal (S(t)*cos(2*pi*fc*t)) represents the carrier cos(2*pi*fc*t) carrying S(t) (which is a function of time t), the AM signal's envelope corresponds to S(t), pi (i.e. π) represents the ratio of the circumference of a circle to its diameter, and fc represents the frequency of the carrier cos(2*pi*fc*t).

According to the first embodiment, the carrier of the AM signal to be demodulated has a first frequency (i.e. the frequency fc in this embodiment). As shown in FIG. 2, the digital demodulation device 100 comprises an analog-to-digital converter (ADC) 101, a processing circuit 103, and an output stage 105, where the output stage 105 comprises an absolute value calculation unit 140 (which is labeled as "ABS" in this embodiment) and a digital-to-analog converter (DAC) 107. According to this embodiment, S(t) represents an audio signal to be played back, and the digital demodulation device 100 is coupled to an amplifier (Amp) 80 for driving a speaker 90.

In this embodiment, the ADC 101 samples the AM signal (S(t)*cos(2*pi*fc*t)) to generate a plurality of digital values 102 of the AM signal (S(t)*cos(2*pi*fc*t)), and the processing circuit 103 performs first path digital processing and second path digital processing according to a second frequency (fc+fd) and the digital values 102 of the AM signal (S(t)*cos(2*pi*fc*t)). T the first path digital processing represents performing down conversion by mixing the AM signal with a first sinusoidal signal whose frequency is equal to the second frequency (fc+fd), and the second path digital processing represents performing down conversion by mixing the AM signal with a second sinusoidal signal whose frequency is equal to the second frequency (fc+fd), where the second frequency is equal to the first frequency fc plus a predetermined frequency shift fd, and the second sinusoidal signal is orthogonal to the first sinusoidal signal. In this embodiment, the first sinusoidal signal is cos(2*pi*(fc+fd)*t), and the second sinusoidal signal is sin(2*pi*(fc+fd)*t).

Again in this embodiment, the output stage 105 outputs an output signal 108 according to processing results 104 comprising first processing results of the first path digital processing and second processing results of the second path digital processing. More specifically, the absolute value calculation unit 140 of this embodiment is capable of performing absolute value calculation, such as calculating a square root of the sum of the square of a first processing result and the square of a second processing result to generate an output value of the output signal 108. Similar operations may be repeated by the absolute value calculation unit 140 to generate a plurality of output values 106 corresponding to the first processing results and the second processing results, so the DAC 107 performs digital-to-analog conversion on the output values 106 to output the output signal 108. As a result, the amplifier 80 amplifies the output signal 108 to drive the speaker 90, in order to perform playback of S(t).

It is noted that the predetermined frequency shift fd is intentionally provided in the present invention, where the predetermined frequency shift fd in this embodiment is not less than an upper bond frequency of a sensitive range of human hearing (e.g. approximately 20000 Hz), so that a noise component corresponding to the predetermined frequency shift fd in the output signal 108 is able to be reduced or removed such that it is not heard.

Regarding the related art problem of the inaccurate frequency fc', although the term fc in the second frequency (fc+fd) utilized by the processing circuit 103 may be not entirely accurate, there is no noise component, such as the noise component of 50 Hz nonetheless. This is because the predetermined frequency shift fd is typically much greater than the deviation of the term fc. As a result, the predetermined frequency shift fd may play the role of dominating the deviation of the inaccurate frequency fc' and shifting the 50 Hz noise component to an insensitive or inaudible range of human hearing. As a result, the related art problem of the inaccurate frequency fc' is solved without introducing cumbersome calculations for locking a locally generated frequency onto the carrier frequency fc generated in the transmitter.

Figure 3:
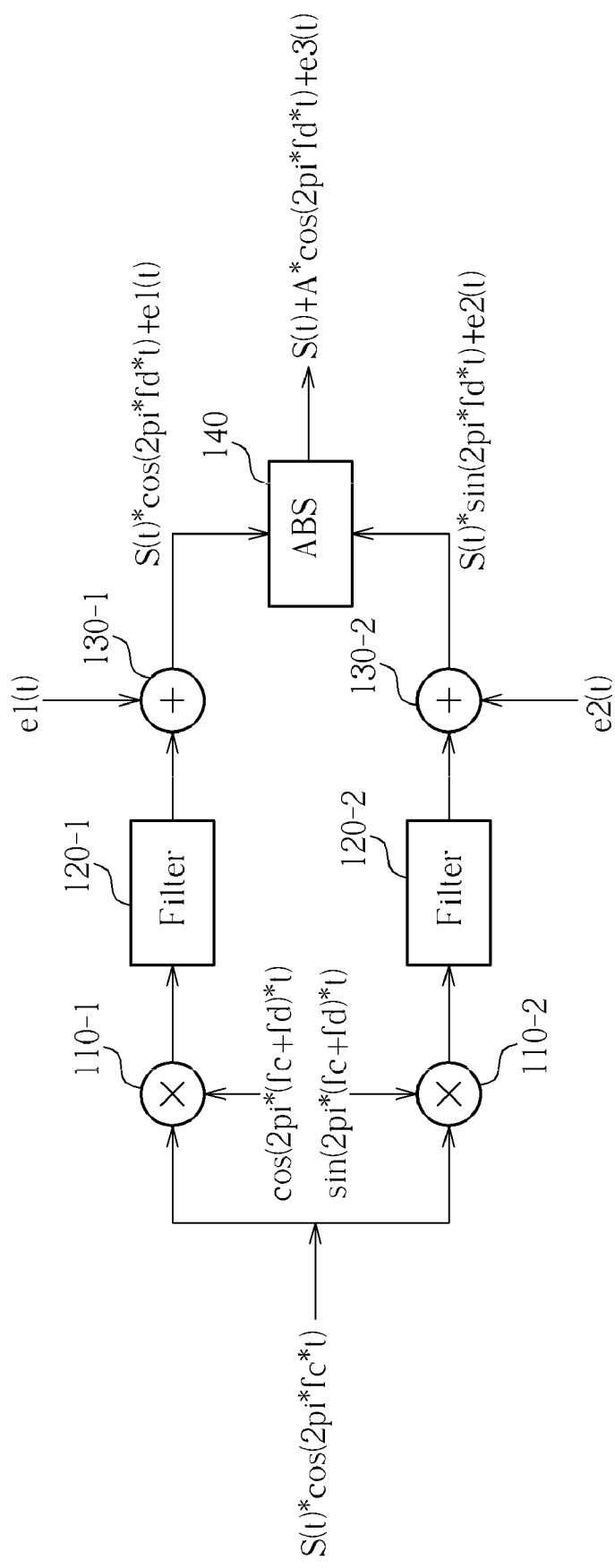
FIG. 3 illustrates a mathematical model of the digital demodulation device shown in FIG. 2.

Please refer to FIG. 3. FIG. 3 illustrates a mathematical model of the digital demodulation device 100 shown in FIG. 2. As shown in FIG. 3, mixers 110-1 and 110-2, filters 120-1 and 120-2, and the absolute value calculation unit 140 represent digital operations of mixing, filtering, and the absolute value calculation, respectively. In addition, adders 130-1 and 130-2 represent involving quantization noises e1(t) and e2(t) during digital operations of the upper and the lower paths shown in FIG. 3, respectively. It is noted that the upper and the lower paths can be referred to as I and Q paths, respectively.

According to this embodiment, the mixer 110-1 mixes the AM signal (S(t)*cos(2*pi*fc*t)) with the first sinusoidal signal cos(2*pi*(fc+fd)*t) and the mixer 110-2 mixes the AM signal (S(t)*cos(2*pi*fc*t)) with the second sinusoidal signal sin(2*pi*(fc+fd)*t), so the digital demodulation device 100 generates a demodulated result (S(t)+(A*cos (2*pi*fd*t))+e3(t)), where e3(t) represents random noises from the quantization noises e1(t) and e2(t). As the carrier frequency of the component (A*cos(2*pi*fd*t)) is substantially similar to the predetermined frequency shift fd (if the term fc in the second frequency (fc+fd) utilized by the processing circuit 103 is not entirely accurate) or equal to the predetermined frequency shift fd, which is intentionally provided in the present invention, the noise component (A*cos(2*pi*fd*t)) corresponding to the predetermined frequency shift fd in the output signal 108 is capable of being reduced or removed since the predetermined frequency shift fd provided in this embodiment is designated to locate the noise component (A*cos(2*pi*fd*t)) in an insensitive or inaudible range of human hearing.

According to a variation of the embodiment shown in FIG. 2, the mixers 110-1 and 110-2 and the filters 120-1 and 120-2 can be exact components within the processing circuit 103. In this variation, the processing circuit 103 comprises a first path and a second path (i.e. the I and Q paths mentioned above). In addition, the first path comprises the mixer 110-1 and the filter 120-1 coupled to the mixer 110-1, where the mixer 110-1 is a multiplier that is utilized for respectively multiplying the digital values of the AM signal by values representing the first sinusoidal signal to generate first intermediate values, and the filter 120-1 is utilized for filtering the first intermediate values to generate the first processing results. Additionally, the second path comprises the mixer 110-2 and the filter 120-2 coupled to the mixer 110-1, where the mixer 110-2 is a multiplier that is utilized for respectively multiplying the digital values of the AM signal by values representing the second sinusoidal signal to generate second intermediate values, and the filter 120-2 is utilized for filtering the second intermediate values to generate the second processing results.

According to another variation of the embodiment shown in FIG. 2, the mixers 110-1 and 110-2 and the filters 120-1 and 120-2 can be exact components within the processing circuit 103. The differences between this variation and the previous variation are described as follows. The processing circuit 103 comprises a multiplier that can be utilized for multiplying the digital values of the AM signal by values representing the first sinusoidal signal to generate the first processing results or for multiplying the digital values of the AM signal by values representing the second sinusoidal signal to generate the second processing results. The processing circuit 103 comprises a filter that can be utilized for filtering the first intermediate values to generate the first processing results or for filtering the second intermediate values to generate the second processing results.

According to another variation of the embodiment shown in FIG. 2, at least a portion of the digital demodulation device 100 is integrated into a single chip. For example, the processing circuit 103 and the output stage 105 are integrated into a single chip. In another example of this variation, the processing circuit 103 and the absolute value calculation unit 140 are integrated into a single chip. In another example of this variation, the ADC 101, the processing circuit 103, and the absolute value calculation unit 140 are integrated into a single chip. Yet in another example of this variation, the ADC 101, the processing circuit 103, and the output stage 105 are all integrated into a single chip.

According to another variation of the embodiment shown in FIG. 2, the ADC 101 can be removed from the digital demodulation device 100 and implemented outside the digital demodulation device 100. Yet according to another variation of the embodiment shown in FIG. 2, the DAC 107 can be removed from the digital demodulation device 100 and implemented outside the digital demodulation device 100.

According to a second embodiment, which is a variation of the embodiment shown in FIG. 2, S(t) is not limited to be an audio signal to be played back, and the digital demodulation device 100 can be coupled to a latter stage (not shown) of the output stage 105 instead of being coupled to the amplifier 80 mentioned above, where the latter stage of this embodiment is outside the digital demodulation device 100. The predetermined frequency shift fd of the second embodiment is not less than a cut-off frequency of the latter stage, so that the noise component (A*cos(2*pi*fd*t)) corresponding to the predetermined frequency shift fd in the output signal 108 is capable of being reduced or removed eventually.

According to a variation of the second embodiment, the latter stage is a speaker, whose cut-off frequency is less than the predetermined frequency shift fd.

According to a third embodiment, which is a variation of the embodiment shown in FIG. 2, S(t) is not limited to be an audio signal to be played back, and the digital demodulation device 100 can be coupled to a latter stage (not shown) of the output stage 105 instead of being coupled to the amplifier 80 mentioned above, where the digital demodulation device 100 further comprises the latter stage, i.e. the latter stage is within the digital demodulation device 100. The predetermined frequency shift fd of the third embodiment is not less than a cut-off frequency of the latter stage, so that the noise component (A*cos(2*pi*fd*t)) corresponding to the predetermined frequency shift fd in the output signal 108 is capable of being reduced or eventually removed.

Figure 4:
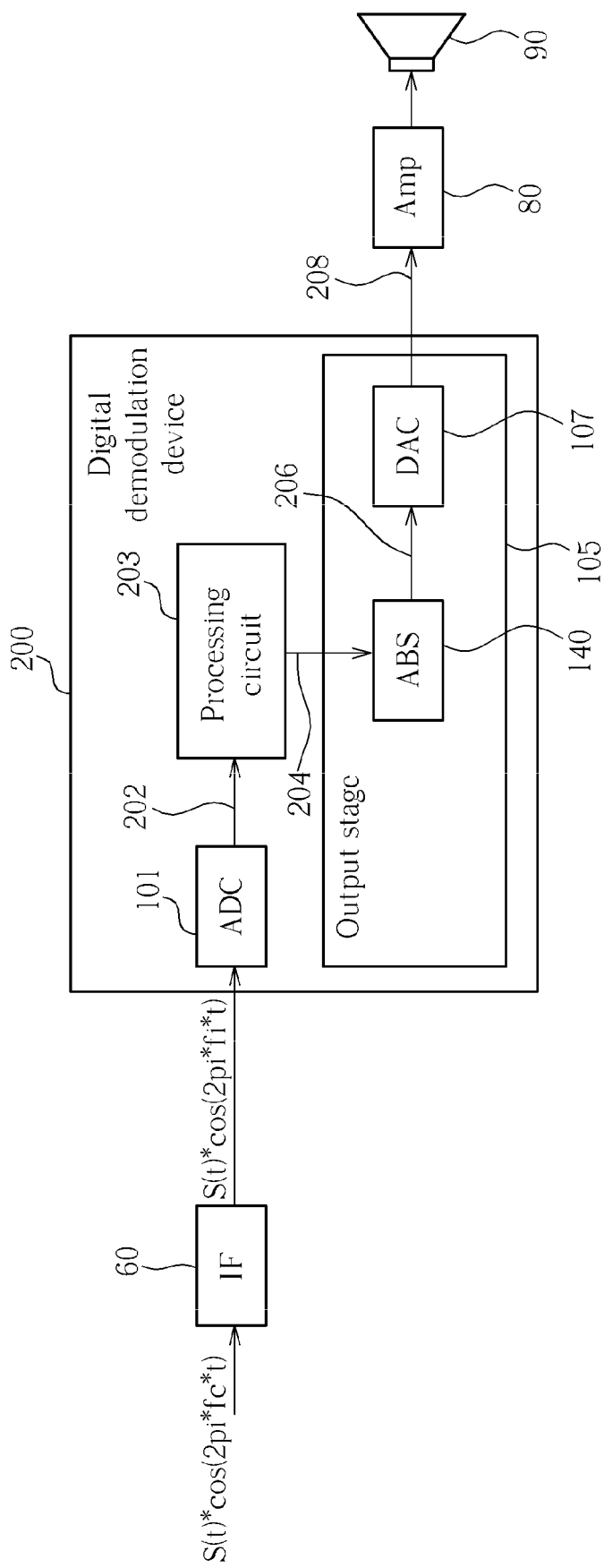
FIG. 4 is a diagram of a digital demodulation device for demodulating an AM signal according to one embodiment of the present invention.
Figure 5:
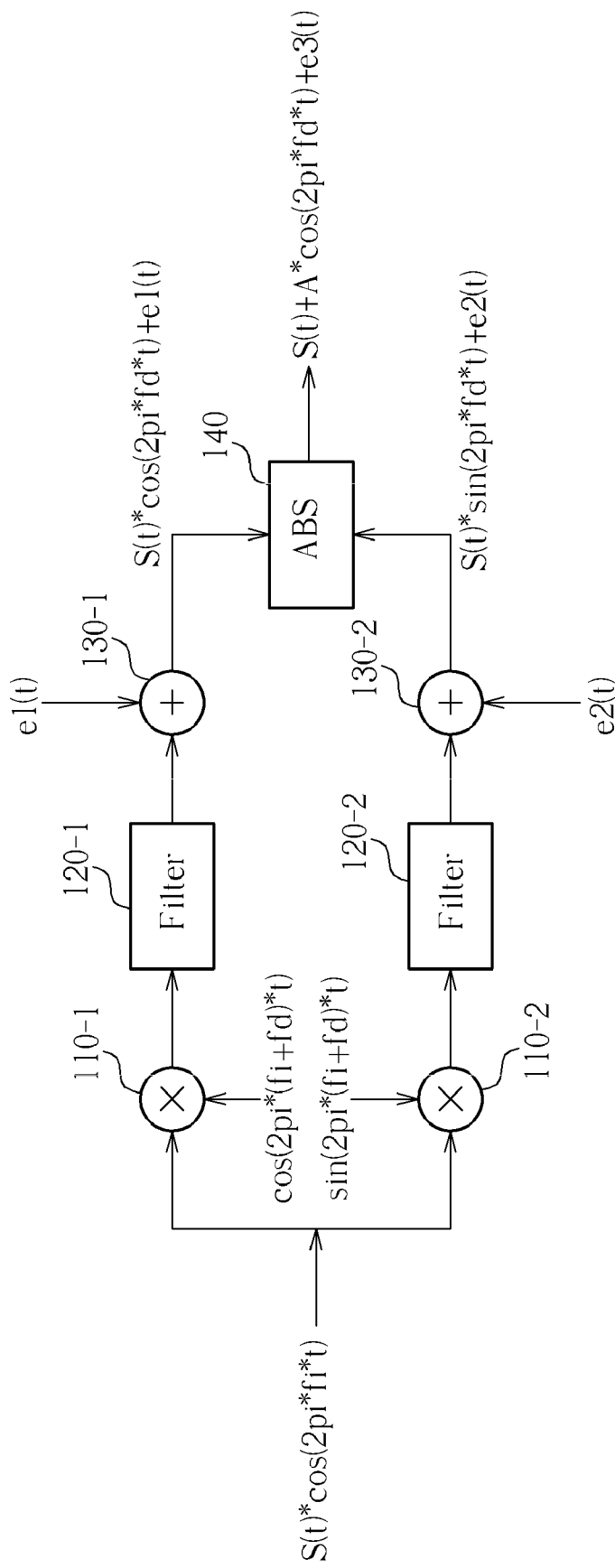
FIG. 5 illustrates a mathematical model of the digital demodulation device shown in FIG. 4.

Please refer to FIG. 4 and FIG. 5. FIG. 4 is a diagram of a digital demodulation device 200 for demodulating an AM signal according to one embodiment of the present invention, where FIG. 5 illustrates a mathematical model of the digital demodulation device 200 shown in FIG. 4. This embodiment is a variation of the first embodiment. As shown in FIG. 4, the AM signal to be demodulated by the digital demodulation device 200 is an intermediate frequency (IF) signal (S(t)*cos(2*pi*fi*t)), where the IF circuit 60 performs down conversion on the AM signal (S(t)*cos(2*pi*fc*t)) mentioned above to generate the IF signal (S(t)*cos(2*pi*fi*t)). Similar descriptions are not repeated for this embodiment here.

Figure 6:
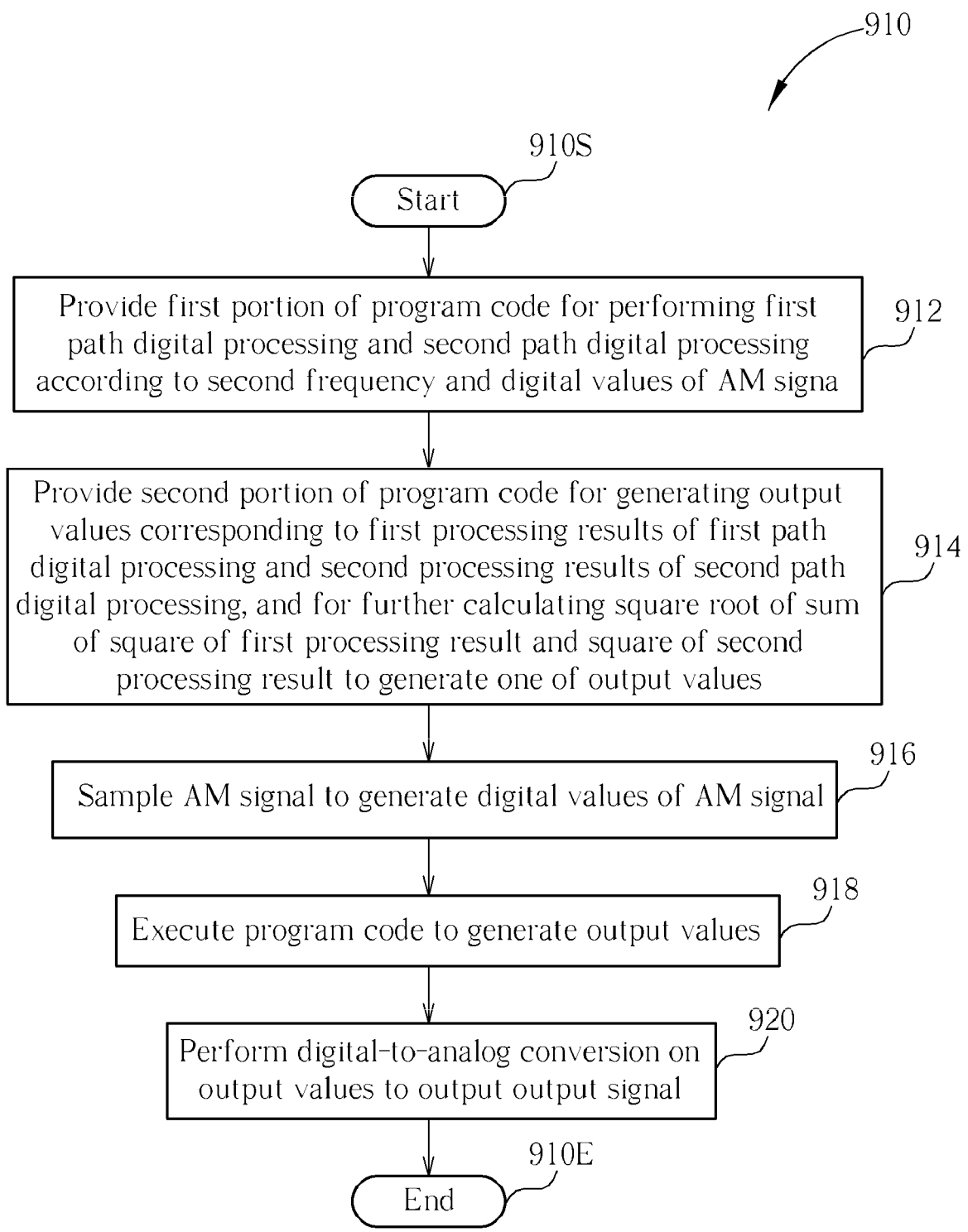
FIG. 6 is a flowchart of a digital demodulation method for demodulating an AM signal according to one embodiment of the present invention.

According to another embodiment of the present invention, a processing circuit (not shown) can be utilized for executing at least one program code to perform at least one portion of the digital operations of the digital demodulation devices (e.g. the digital demodulation device 100 or the digital demodulation device 200) in the embodiments or variations mentioned above. FIG. 6 is a flowchart of a digital demodulation method 910 for demodulating an AM signal according to this embodiment, where the AM signal to be demodulated can be the AM signal (S(t)*cos(2*pi*fc*t)) or the AM signal (S(t)*cos(2*pi*fi*t)) corresponding to one of the embodiments or variations mentioned above, and the AM signal's carrier has the first frequency (e.g. fc or fi) correspondingly. The digital demodulation method can be described as follows:

In Step 912, provide a first portion of the program code for performing the first path digital processing and the second path digital processing according to the second frequency and the digital values of the AM signal.

In Step 914, provide a second portion of the program code for generating the output values corresponding to the first processing results of the first path digital processing and the second processing results of the second path digital processing, and for further calculating a square root of the sum of the square of a first processing result and the square of a second processing result to generate one of the output values.

In Step 916, sample the AM signal to generate the digital values of the AM signal.

In Step 918, utilize the processing circuit of this embodiment to execute the program code to generate the output values (e.g. the output values 106 shown in FIG. 2 or the output values 206 shown in FIG. 4).

In Step 920, perform digital-to-analog conversion on the output values to output the output signal (e.g. the output signal 108 shown in FIG. 2 or the output signal 208 shown in FIG. 4).

Similarly, the predetermined frequency shift is not less than the upper bond frequency of the sensitive range of human hearing or a cut-off frequency of a latter stage for directly or indirectly utilizing the output values, so that the noise component corresponding to the predetermined frequency shift in the output signal is capable of being reduced or eventually removed. Similar descriptions are not repeated for this embodiment here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital demodulation device for demodulating an amplitude modulation (AM) signal whose carrier has a first frequency, the digital demodulation device comprising:
    a processing circuit for performing first path digital processing and second path digital processing according to a second frequency and a plurality of digital values of the AM signal, wherein the first path digital processing represents performing down conversion by mixing the AM signal with a first sinusoidal signal whose frequency is equal to the second frequency, the second path digital processing represents performing down conversion by mixing the AM signal with a second sinusoidal signal whose frequency is equal to the second frequency, the second frequency is equal to the first frequency plus a predetermined frequency shift, and the second sinusoidal signal is orthogonal to the first sinusoidal signal; and
    an output stage, coupled to the processing circuit, for outputting an output signal according to first processing results of the first path digital processing and second processing results of the second path digital processing;
    wherein the predetermined frequency shift is not less than an upper bond frequency of a sensitive range of human hearing or a cut-off frequency of a latter stage of the output stage, so that a noise component corresponding to the predetermined frequency shift in the output signal is capable of being reduced or removed.

2. The digital demodulation device of claim 1, wherein the processing circuit comprises:
    a first path comprising:
        a first multiplier for respectively multiplying the digital values of the AM signal by values representing the first sinusoidal signal to generate first intermediate values; and
        a first filter, coupled to the first multiplier, for filtering the first intermediate values to generate the first processing results; and
    a second path comprising:
        a second multiplier for respectively multiplying the digital values of the AM signal by values representing the second sinusoidal signal to generate second intermediate values; and
        a second filter, coupled to the second multiplier, for filtering the second intermediate values to generate the second processing results.

3. The digital demodulation device of claim 1, wherein the processing circuit comprises:
    at least one multiplier for multiplying the digital values of the AM signal by values representing the first sinusoidal signal to generate the first processing results, or for multiplying the digital values of the AM signal by values representing the second sinusoidal signal to generate the second processing results.

4. The digital demodulation device of claim 1, further comprising:
    an analog-to-digital converter (ADC), coupled to the processing circuit, for sampling the AM signal to generate the digital values of the AM signal.

5. The digital demodulation device of claim 1, wherein the output stage calculates a square root of the sum of the square of a first processing result and the square of a second processing result to generate an output value of the output signal.

6. The digital demodulation device of claim 1, wherein the output stage generates a plurality of output values corresponding to the first processing results and the second processing results, and the output stage comprises:
    a digital-to-analog converter (DAC) for performing digital-to-analog conversion on the output values to output the output signal.

7. The digital demodulation device of claim 1, wherein at least a portion of the digital demodulation device is integrated into a single chip.

8. The digital demodulation device of claim 1, wherein the predetermined frequency shift is greater than or equal to the cut-off frequency, and the digital demodulation device comprises the latter stage.

9. The digital demodulation device of claim 1, wherein the predetermined frequency shift is greater than or equal to the cut-off frequency, and the latter stage is outside the digital demodulation device.

10. The digital demodulation device of claim 1, wherein the predetermined frequency shift is greater than or equal to the cut-off frequency, and the latter stage is a speaker.

11. A digital demodulation method for demodulating an amplitude modulation (AM) signal whose carrier has a first frequency, the digital demodulation method comprising:
    performing first path digital processing and second path digital processing according to a second frequency and a plurality of digital values of the AM signal, wherein the first path digital processing represents performing down conversion by mixing the AM signal with a first sinusoidal signal whose frequency is equal to the second frequency, the second path digital processing represents performing down conversion by mixing the AM signal with a second sinusoidal signal whose frequency is equal to the second frequency, the second frequency is equal to the first frequency plus a predetermined frequency shift, and the second sinusoidal signal is orthogonal to the first sinusoidal signal; and
    outputting an output signal according to first processing results of the first path digital processing and second processing results of the second path digital processing;
    wherein the predetermined frequency shift is not less than an upper bond frequency of a sensitive range of human hearing or a cut-off frequency of a latter stage for utilizing the output signal, so that a noise component corresponding to the predetermined frequency shift in the output signal is capable of being reduced or removed.

12. The digital demodulation method of claim 11, wherein the step of performing the first path digital processing further comprises:

respectively multiplying the digital values of the AM signal by values representing the first sinusoidal signal to generate first intermediate values; and filtering the first intermediate values to generate the first processing results;

wherein the step of performing the second path digital processing further comprises:

respectively multiplying the digital values of the AM signal by values representing the second sinusoidal signal to generate second intermediate values; and filtering the second intermediate values to generate the second processing results.

13. The digital demodulation method of claim 11, wherein the step of performing the first path digital processing and the second path digital processing further comprises:

multiplying the digital values of the AM signal by values representing the first sinusoidal signal to generate the first processing results; or multiplying the digital values of the AM signal by values representing the second sinusoidal signal to generate the second processing results.

14. The digital demodulation method of claim 11, further comprising:

sampling the AM signal to generate the digital values of the AM signal.

15. The digital demodulation method of claim 11, wherein the step of outputting the output signal further comprises:

calculating a square root of the sum of the square of a first processing result and the square of a second processing result to generate an output value of the output signal.

16. The digital demodulation method of claim 11, wherein the step of outputting the output signal further comprises:

generating a plurality of output values corresponding to the first processing results and the second processing results; and performing digital-to-analog conversion on the output values to output the output signal.

17. A digital demodulation method for demodulating an amplitude modulation (AM) signal whose carrier has a first frequency, the digital demodulation method comprising:

providing a first portion of a program code for performing first path digital processing and second path digital processing according to a second frequency and a plurality of digital values of the AM signal, wherein the first path digital processing represents performing down conversion by mixing the AM signal with a first sinusoidal signal whose frequency is equal to the second frequency, the second path digital processing represents performing down conversion by mixing the AM signal with a second sinusoidal signal whose frequency is equal to the second frequency, the second frequency is equal to the first frequency plus a predetermined frequency shift, and the second sinusoidal signal is orthogonal to the first sinusoidal signal; and providing a second portion of the program code for generating a plurality of output values corresponding to first processing results of the first path digital processing and second processing results of the second path digital processing;

wherein the predetermined frequency shift is not less than an upper bond frequency of a sensitive range of human hearing or a cut-off frequency of a latter stage for directly or indirectly utilizing the output values, so that a noise component corresponding to the predetermined frequency shift in an output signal for carrying the output values is capable of being reduced or removed.

18. The digital demodulation method of claim 17, further comprising:

sampling the AM signal to generate the digital values of the AM signal; and executing the program code to generate the output values.

19. The digital demodulation method of claim 17, further comprising:

executing the program code to generate the output values; and performing digital-to-analog conversion on the output values to output the output signal;

wherein the predetermined frequency shift is not less than the upper bond frequency or the cut-off frequency of the latter stage for utilizing the output signal, so that the noise component corresponding to the predetermined frequency shift in the output signal is capable of being reduced or removed eventually.

20. The digital demodulation method of claim 17, wherein the step of providing the second portion of the program code further comprises:

providing the second portion of the program code for further calculating a square root of the sum of the square of a first processing result and the square of a second processing result to generate one of the output values.

\* \* \* \* \*